(12) United States Patent
Rubacha et al.

(10) Patent No.: US 6,931,124 B1
(45) Date of Patent: Aug. 16, 2005

(54) SOFT MUTE CIRCUIT

(75) Inventors: Raymond Rubacha, Chandler, AZ (US); Samuel L. Thomasson, Gilbert, AZ (US)

(73) Assignee: Acoustic Technology, Inc., Mesa, AZ (US)

( * ) Notice: Subject to any disclaimer, the term of this patent is extended or adjusted under 35 U.S.C. 154(b) by 0 days.

(21) Appl. No.: 09/482,229

(22) Filed: Jan. 13, 2000

(51) Int. Cl.$^7$ ................................................. H04M 1/00
(52) U.S. Cl. ................. 379/421; 379/419; 379/420.01; 379/420.02; 379/420.03; 379/420.04; 381/94.5; 84/627; 84/633; 84/663; 84/665; 84/702; 84/711
(58) Field of Search ............................... 379/393, 421; 330/254, 278, 279; 381/104–108, 94.5; 84/627, 84/633, 663, 665, 702, 711

(56) References Cited

U.S. PATENT DOCUMENTS

| | | | | |
|---|---|---|---|---|
| 4,267,763 A | * | 5/1981 | Futamase et al. | ............... 84/623 |
| 4,352,958 A | | 10/1982 | Davis et al. | ............ 179/84 VF |
| 4,451,706 A | * | 5/1984 | Boeckmann | ................ 379/387 |
| 4,659,876 A | * | 4/1987 | Sullivan et al. | ........... 379/93.19 |
| 4,675,905 A | | 6/1987 | Flora et al. | .................... 381/81 |
| 4,879,745 A | | 11/1989 | Arbel | .......................... 379/389 |
| 4,983,927 A | | 1/1991 | Torazzina | .................... 330/51 |
| 4,991,167 A | | 2/1991 | Petri et al. | .................. 370/32.1 |
| 5,187,734 A | | 2/1993 | Takahashi et al. | ............ 379/79 |
| 5,592,403 A | * | 1/1997 | Trager et al. | ................ 708/300 |
| 5,606,625 A | | 2/1997 | Dallavalle et al. | .......... 381/107 |
| 5,729,603 A | * | 3/1998 | Huddart et al. | ............. 379/387 |
| 5,909,432 A | * | 6/1999 | Arends et al. | ............... 370/261 |
| 5,915,030 A | | 6/1999 | Viebach | ..................... 381/94.5 |
| 5,920,833 A | * | 7/1999 | Dierke | ....................... 704/230 |
| 5,925,146 A | * | 7/1999 | Murata et al. | .............. 714/746 |
| 5,991,398 A | * | 11/1999 | Lipton et al. | ................ 379/383 |
| 6,008,703 A | * | 12/1999 | Perrott et al. | ................ 332/100 |
| 6,111,965 A | * | 8/2000 | Lubbe et al. | ............... 381/94.5 |
| 6,154,548 A | | 11/2000 | Bizzan | ........................ 381/94.5 |
| 6,249,158 B1 | * | 6/2001 | Schillhof et al. | ............ 327/124 |
| 6,292,560 B1 | * | 9/2001 | Gligoric | ...................... 379/393 |
| 6,466,832 B1 | * | 10/2002 | Zuqert et al. | ................ 370/330 |
| 6,493,450 B1 | * | 12/2002 | Scheuer et al. | ................ 381/57 |
| 6,608,898 B1 | * | 8/2003 | Moore et al. | ........... 379/388.01 |

* cited by examiner

*Primary Examiner*—Sinh Tran
*Assistant Examiner*—Ramnandan Singh
(74) *Attorney, Agent, or Firm*—Paul F. Wille

(57) ABSTRACT

A soft mute circuit includes a programmable amplifier controlled by a register. Data is stored in the register from an adder that combines the current data in the register with a second number for increasing or decreasing the gain of the amplifier. A summation circuit includes a plurality of inputs coupled by gates to a summation node and the summation node is coupled to an input of the programmable amplifier. The gates are controlled by suitable logic for selecting input signals in any combination. A control loop maintains the gain of the amplifier at a predetermined level.

7 Claims, 3 Drawing Sheets

SOFT MUTE CIRCUIT

CROSS-REFERENCE TO RELATED APPLICATION

This application includes disclosure contained in application Ser. No. 09/476,468, filed Dec. 30, 1999, entitled Band-by-Band Full Duplex Communication, assigned to the assignee of this invention. The entire contents of the earlier application is incorporated herein by reference.

BACKGROUND OF THE INVENTION

This invention relates to a soft mute circuit; that is, a circuit for masking transients in an audio electronic device. As used herein, a "transient" is an abrupt change in the operation of a circuit or a spurious signal caused by such abrupt change.

Anyone who has ever put on earphones before plugging the earphones into an operating radio, stereo, or cellular telephone knows well the sound of transients. Other transients occur during the operation of audio electronic devices. In a device such as a telephone or a hearing aid, the transients can be particularly annoying. Such transients arise from switching circuitry within the device as the device changes state. Telephone systems, for example, have at least two channels and a plurality of filters in each channel. The various combinations of channels and filters are switch selected and the changes can be heard easily, to the annoyance of the user.

In the prior art, such transients were generally handled by filtering or by carefully matching voltage levels. U.S. Pat. No. 4,983,927 (Torazzina) discloses a bias circuit that causes a power amplifier to go through "mute" and "standby" states when the amplifier changes from normal operation to "cutoff" for blocking transients.

Unlike the Torazzina patent, it is desired to selectively mute signals from a plurality of sources. It is also desired to control the depth and duration of the mute better.

In view of the foregoing, it is therefore an object of the invention to provide an improved mute circuit for unobtrusively masking transients in an audio device.

Another object of the invention is to provide a mute circuit that can operate on several signals in any combination.

A further object of the invention is to provide a mute circuit wherein the depth and duration of the mute are adjustable.

Another object of the invention is to provide a soft mute for a telephone.

SUMMARY OF THE INVENTION

The foregoing objects are achieved in this invention in which the soft mute circuit includes a programmable amplifier controlled by a register. Data is stored in the register from an adder that combines the current data in the register with a second number for increasing or decreasing the gain of the amplifier. A summation circuit includes a plurality of inputs coupled by gates to a summation node and the summation node is coupled to an input of the programmable amplifier. The gates are controlled by suitable logic for selecting input signals in any combination. A control loop maintains the gain of the amplifier at a predetermined level.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
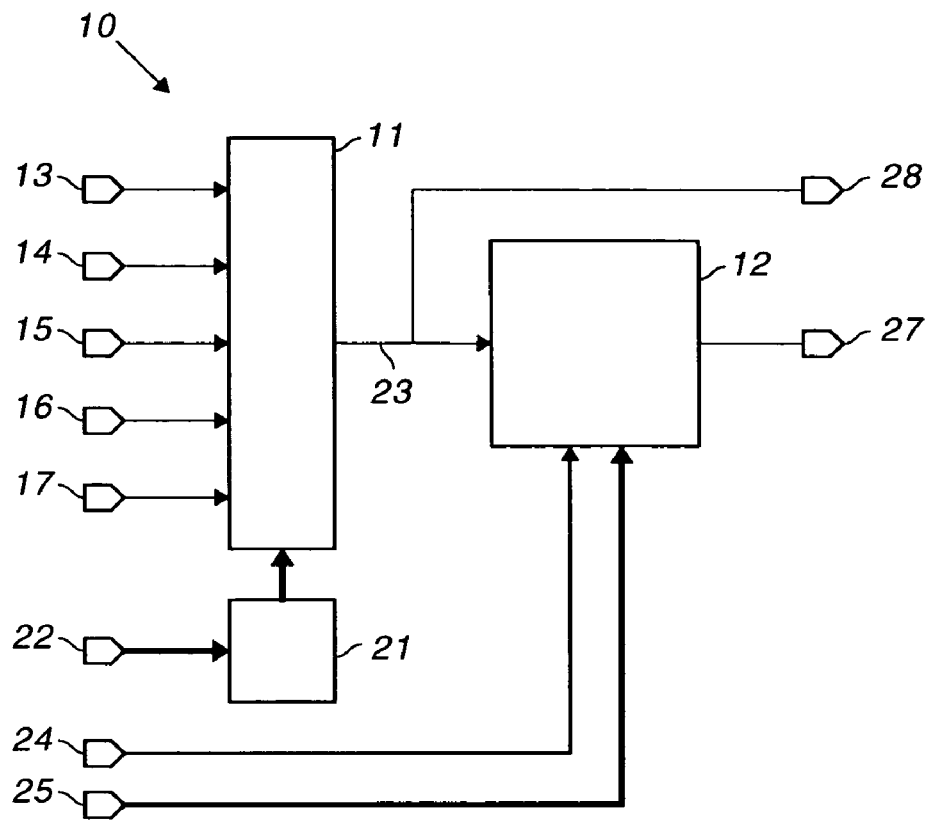
FIG. 1 is a block diagram of a soft mute circuit constructed in accordance with a preferred embodiment of the invention.

In FIG. 1, soft mute circuit 10 includes summation circuit 11 and variable gain circuit 12. Inputs 13, 14, 15, 16, and 17 are from separate signal sources [not shown] and are selected in accordance with data on input 22 by way of decoder 21. In the figures, plural lines are represented by a single heavy line rather than a plurality of thinner lines. Input 22 is actually five inputs, one enable line for each signal line.

A multiplex circuit could be used instead of summation circuit 11. An advantage of having a summation circuit shown is that the signal lines can be summed in any combination on output line 23. Circuit 12 includes a variable gain amplifier that adjusts the amplitude of the signal on line 23 and couples the adjusted signal to circuit output 27. Output 28 provides the summed signals unadjusted.

Figure 3:
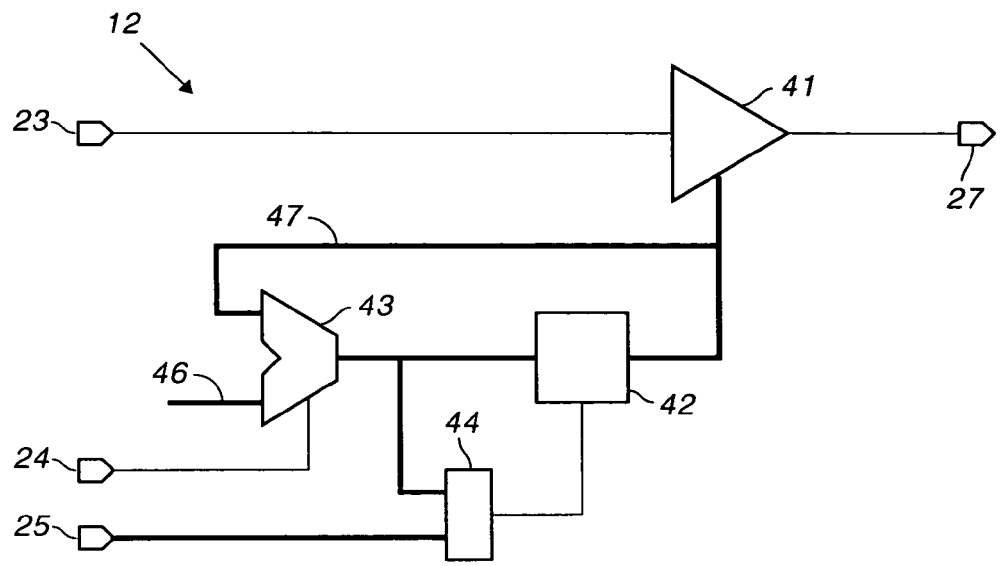
FIG. 3 is a more detailed diagram of the variable gain circuit represented by block 12 in FIG. 1.

Circuit 12 is controlled by enable input 24 and gain input 25. In a preferred embodiment of the invention, gain input 25 is actually an eight bit data bus. The data on the bus determines the maximum amplitude of the signal on output 27. The operation of soft mute circuit 10 is illustrated in FIG. 3. Assuming unity (zero dB) gain as an initial condition, a logic "1" on enable input 24 causes the gain of circuit 12 to decrease incrementally for as long as pin 24 remains at a logic "1" or until a minimum gain is reached.

The gain remains at minimum 31 (FIG. 2), represented by gap 32, for as long as a logic "1" is applied to input 24. When a logic "0" is applied to input 34, the gain of the circuit increases to a value corresponding the data on input 25. The gain can be more or less than zero dB and can remain at some intermediate value, represented by line 34, for some time before being changed to another value in accordance with the data on input 25.

FIG. 3 illustrates circuit 12 in greater detail. Programmable gain amplifier 41 has a signal input coupled to line 23 and a control input coupled to register 42. The output of register 42 is also coupled to one input of adder 43. Comparator 44 compares the output from adder 43 with the data on gain input 25 and, if the output is equal to or greater than the data, the data is locked in register 42 and the gain of amplifier remains constant until the next enable signal on input 24.

Enable input 24 is coupled to the add/subtract input of adder 43, causing the data on bus 46 to be added to, or subtracted from, the data on bus 47. In this way, the rate of change, i.e. the size of the steps shown in FIG. 2, can be adjusted to suit a particular application. The size of the step need not be the same for counting up as for counting down.

In one embodiment of the invention, having a clock of 44.1 kHz., amplifier 41 had a maximum gain of approximately 1.93 and unity gain at $B4_{16}$ (10110100). Counting from 0 to $FF_{16}$ took 5.8 milliseconds, incrementing every twenty-three microseconds (one count per clock cycle). This rate does not cause a noticeable sound and is not perceptible as fading.

Figure 2:
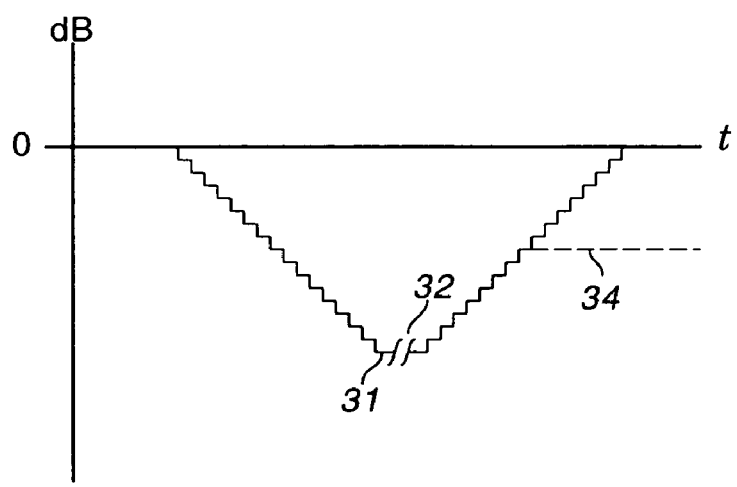
FIG. 2 is a chart illustrating the operation of the circuit of FIG. 1.

Changing the data on input 46 changes the slope of the stairstep shown in FIG. 2. For example, if the count in register 42 is incremented by two on each clock cycle, the gain decreases, or increases, twice as fast. The duration of the gap 32 depends upon the application and could be several hours or more or could be as short as one clock cycle. Enable 24 (FIG. 3) does not have to remain a logic "1" until a minimum gain is reached, although for most applications this would be the case. The actual value of minimum gain depends upon the particular amplifier but should be at least −40 dB.

Figure 4:
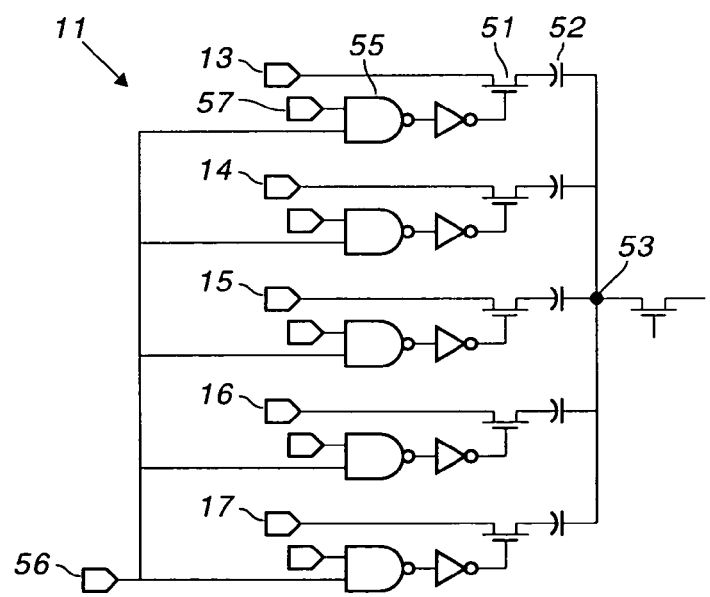
FIG. 4 is a schematic of summation circuit 11 in FIG. 1.

FIG. 4 illustrates summation circuit 11 in greater detail. In one embodiment of the invention, switched capacitor circuits and differential signals were used for improved noise immunity. FIG. 4 illustrates one half of the circuit for simplicity. The positive and negative halves of the circuits are the same. The circuit was clocked at 44.1 kHz., as noted above.

Summation circuit 11 includes a plurality of identical sections having their outputs coupled to a common node. Each section includes a first input, such as input 13, for receiving a signal, and a gate, such as gate 51, for blocking or passing a signal to storage capacitor 52. One side of storage capacitor 52 is coupled to gate 51 and the other side of the storage capacitor is coupled to node 53.

Gate 51 is controlled by NAND gate 55 having a first input coupled to clock enable 56 in common with the other NAND gates. A second input to NAND gate 55 is coupled to section enable input 57. Thus, the sections are controllable individually and as a group. The output of NAND gate 55 is coupled through an inverter to the control electrode of gate 51. The inverter provides the correct logic level for gate 51.

Depending upon the data on the individual enable inputs, one, some, or all of the signals on inputs 13–17 are coupled to node 53. The discharge currents of the capacitors are summed and applied to variable gain section 12 (FIG. 3). Although implemented in a preferred embodiment as a switched capacitor circuit, other topologies can be used instead, either analog or digital.

Figure 5:
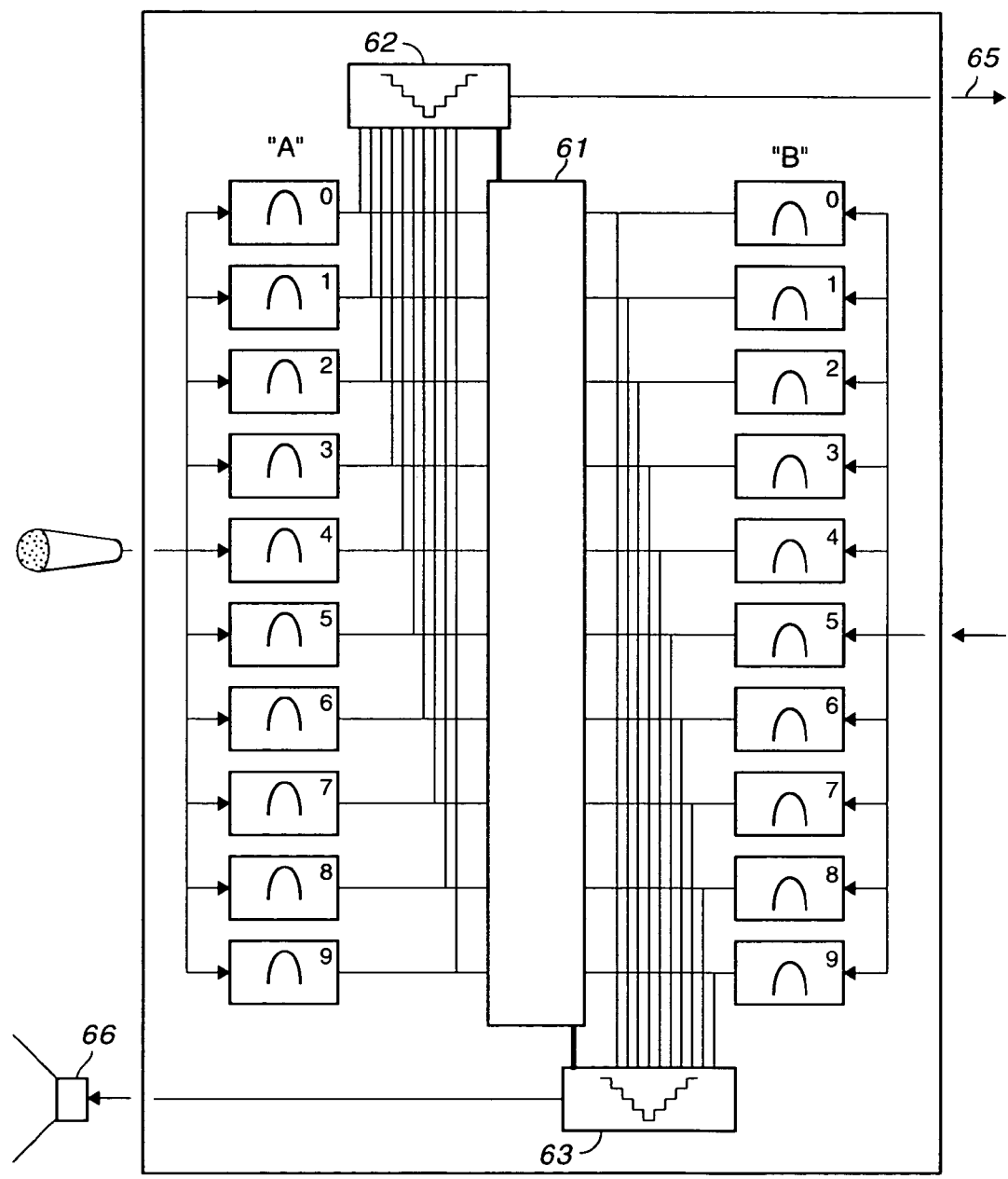
FIG. 5 is a block diagram of a telephone incorporating a mute circuit constructed in accordance with the invention.

FIG. 5 shows the invention used in the noise reduction circuitry of a telephone. Noise in a telephone, including cellular telephones, is any unwanted sound and includes echoes of the voices of the parties to a call. Many techniques have been developed to improve the clarity of the sound in a telephone. One such technique uses what is known as a comb filter; i.e. a plurality of parallel filters wherein band pass filters alternate with band stop filters. As described in the above-identified copending application, each bank of filters in FIG. 5 can be configured by controller 61 to mimic a comb filter, by selecting alternate filters, or to provide a variety of other combinations.

Soft mute circuits 62 and 63, constructed as shown in FIG. 1, provide a multiplexing and summation function in addition to a soft mute function. For example, controller 61 can couple the outputs of the even numbered filters in bank "A" to line output 65 using soft mute circuit 62 and couple the outputs of the odd numbered filters in bank "B" to speaker 66 using soft mute circuit 63. Any change in configuration is not detected by a user because the signals are attenuated during the change but are attenuated only briefly. On the other hand, the attenuation may continue for some time, e.g. when providing half duplex operation.

The invention thus provides a versatile mute circuit having plural functions for unobtrusively masking transients in an audio device. The mute circuit can operate on several signals in any combination and the depth and duration of the mute are independently adjustable.

Having thus described the invention, it will be apparent to those of skill in the art that various modifications can be made within the scope of the invention. For example, instead of using enable 24 for controlling the duration of the mute, one could add a programmable timer triggered by a signal on input 24. The control loop in FIG. 3 could operate on adder 43 instead of register 42 for freezing data when a particular gain were reached, e.g. by coupling zeros to input 46. Programmable gain amplifier can be configured to have gain inversely proportional, rather than proportional, to the data from register 42.

What is claimed as the invention is:

1. A circuit for unobtrusively masking transient signals in an electronic device by changing gain, said circuit comprising:
   an amplifier having a first input for receiving control data and a second input for receiving a signal;
   a register having an output coupled to said first input; and
   an adder having an output coupled to said register for storing data in said register and having a pair of inputs, the output of said register also being coupled to one of said pair of inputs, the second of said pair of inputs being coupled to a source of slope data, said adder having a control input for adding or subtracting the slope data from the output of the register;
   wherein said adder adjusts the gain of said amplifier in accordance with the slope data to change gain gradually.

2. The circuit as set forth in claim 1 and further including a control loop coupled to said adder for holding the gain of said amplifier at a predetermined value.

3. The circuit as set forth in claim 1 and further including a summation circuit coupled to said second input, wherein said summation circuit includes several inputs.

4. The circuit as set forth in claim 3 wherein said summation circuit further includes logic for selecting one, all, or combinations of signals from the several inputs for summation.

5. In a telephone, a soft mute circuit characterized by:
   an amplifier having a first input for receiving control data and a second input for receiving a signal;
   a register having an output coupled to said first input; and
   an adder having an output coupled to said register for storing data in said register and having a pair of inputs, the output of said register also being coupled to one of said pair of inputs, the second of said pair of inputs being coupled to a source of slope data, said adder having a control input for adding or subtracting the slope data from the output of the register;
   wherein said adder adjusts the gain of said amplifier in accordance with the slope data to mute or unmute gradually.

6. The telephone as set forth in claim 5 wherein said telephone includes a summation node and said summation node is coupled to said second input.

7. The telephone as set forth in claim 6 wherein telephone includes a plurality of band pass filters, each of said band pass filters having an output coupled to said summation node.

* * * * *